United States Patent
Matsunaga et al.

[11] Patent Number: 5,522,215
[45] Date of Patent: Jun. 4, 1996

[54] SUBSTRATE COOLING APPARATUS

[75] Inventors: Minobu Matsunaga; Masao Tsuji, both of Kyoto, Japan

[73] Assignee: Dainippon Screen Mfg. Co., Ltd., Japan

[21] Appl. No.: 322,792

[22] Filed: Oct. 13, 1994

[30] Foreign Application Priority Data

Oct. 18, 1993 [JP] Japan .................. 5-284518

[51] Int. Cl.⁶ .................. H01L 21/68; B65G 61/00
[52] U.S. Cl. .................. 62/32; 62/383; 62/161; 165/96
[58] Field of Search .................. 62/3.2, 3.7, 161, 62/378, 383; 165/32, 96

[56] References Cited

U.S. PATENT DOCUMENTS

| | | | |
|---|---|---|---|
| 3,225,820 | 12/1965 | Riordan | 62/383 |
| 3,896,658 | 7/1975 | Hahn | 62/383 |
| 4,281,708 | 8/1981 | Wing et al. | 165/32 |
| 4,619,030 | 10/1986 | Marwick et al. | 29/404 |
| 5,154,661 | 10/1992 | Higgins | 62/3.3 |
| 5,269,146 | 12/1993 | Kerner | 62/3.6 |
| 5,281,516 | 1/1994 | Stapleton et al. | 435/3 |

FOREIGN PATENT DOCUMENTS

| | | |
|---|---|---|
| 46840 | 3/1988 | Japan . |
| 53832 | 5/1991 | Japan . |
| 244095 | 9/1994 | Japan . |

*Primary Examiner*—Henry A. Bennett
*Assistant Examiner*—William C. Doerrler
*Attorney, Agent, or Firm*—Ostrolenk, Faber, Gerb & Soffen

[57] ABSTRACT

A substrate cooling apparatus is provided with a cooling plate disposed in a treating chamber and Peltier elements for supporting and cooling a substrate. A target temperature setter is operable to set a target temperature to which the substrate is to be cooled and a drive device drives the Peltier elements to cool the cooling plate below the target temperature. When the substrate is found to have reached the target temperature, the substrate is raised to a position free from the thermal influence of the cooling plate, to complete a cooling treatment. Consequently, the substrate is cooled at high speed to achieve a reduced cooling time. Where predetermined process modules are used, processing efficiency is improved with a reduced number of substrate cooling elements.

8 Claims, 7 Drawing Sheets

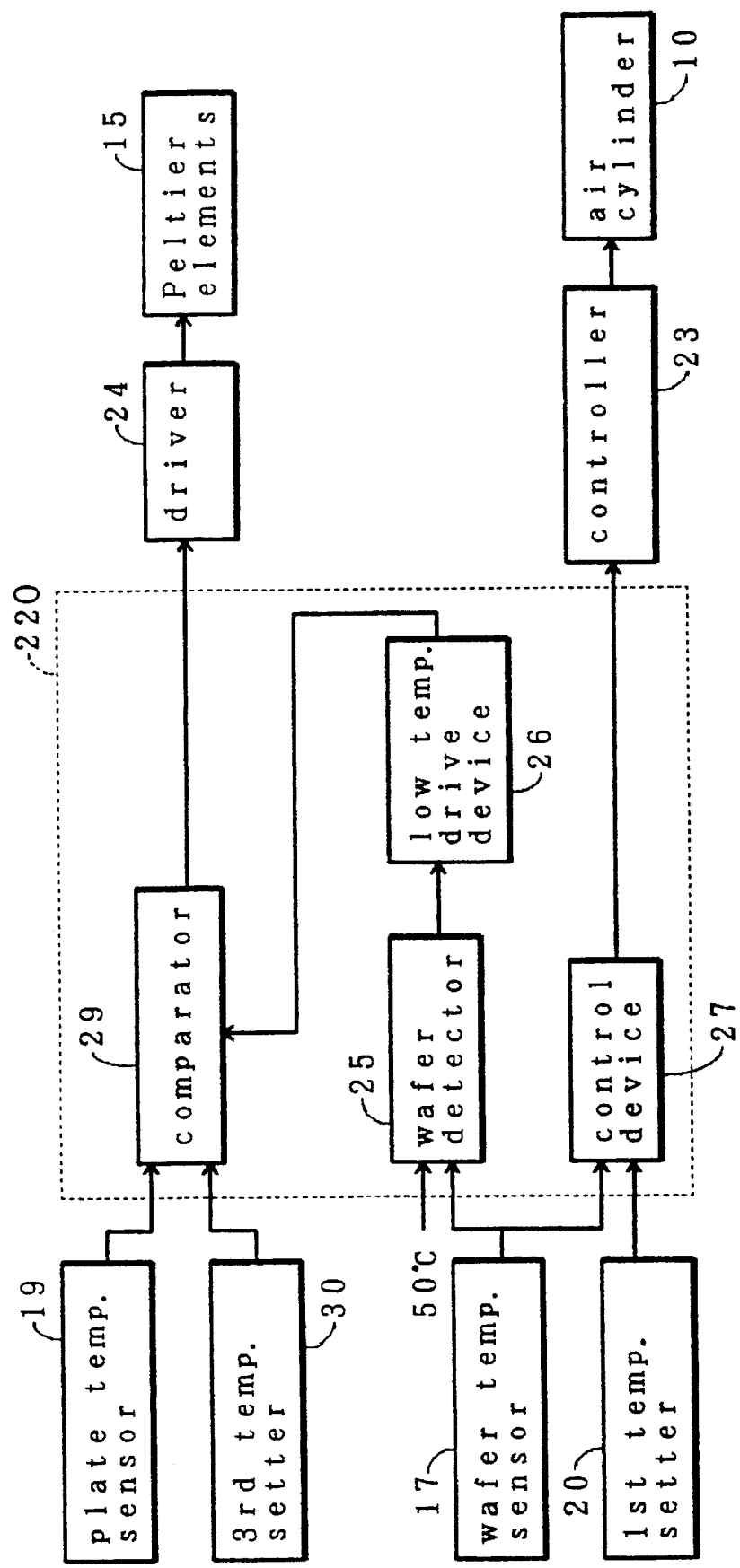

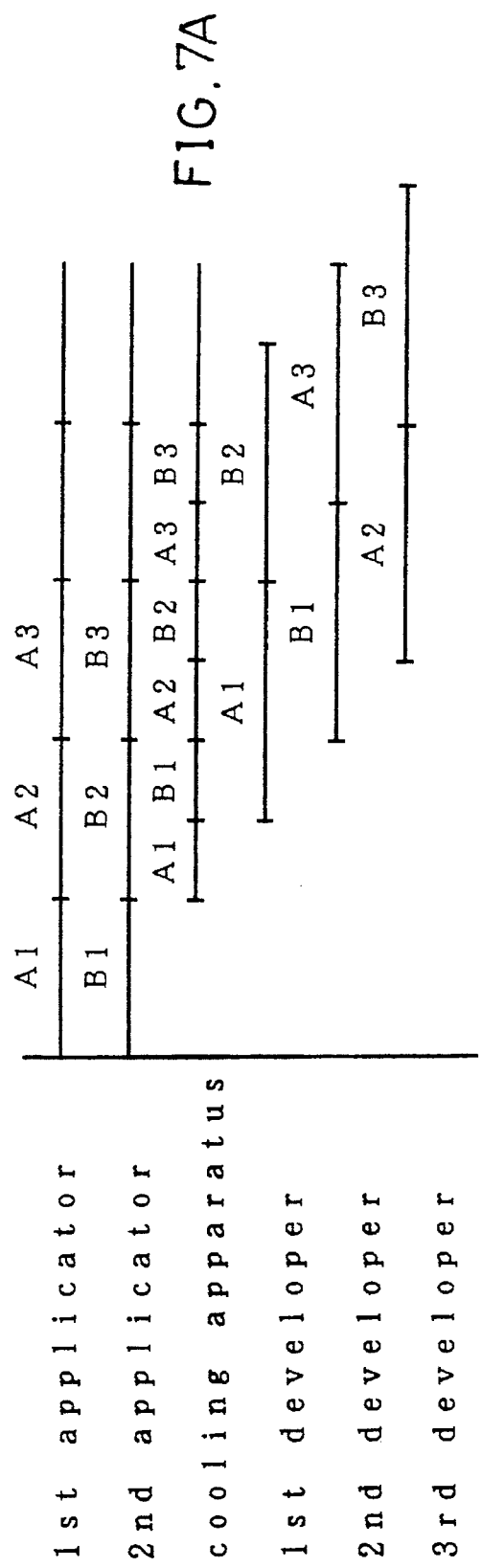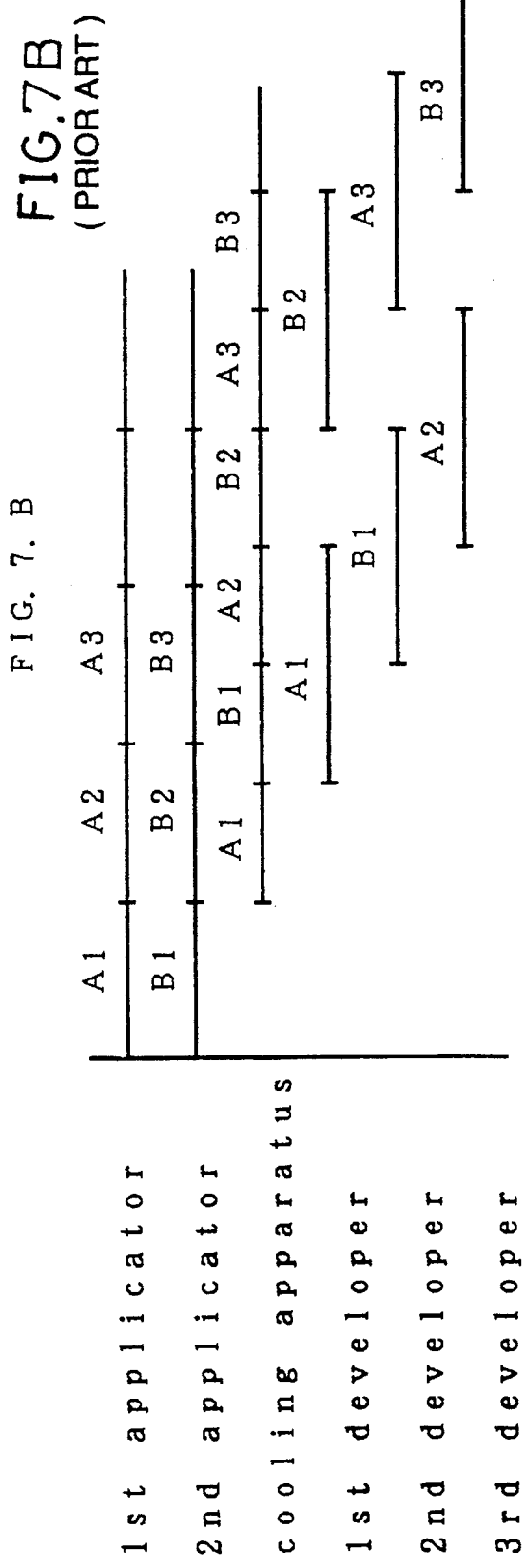

SUBSTRATE COOLING APPARATUS

BACKGROUND OF THE INVENTION (1) Field of the Invention

The present invention relates to apparatus for cooling substrates, such as semiconductor wafers, glass substrates for photomasks, glass substrates for liquid crystal displays or substrates for optical disks, to a target temperature that is approximately room temperature, the substrates having been heated to a high temperature before and/or after one or more steps thereof during production.

(2) Description of the Related Art

Conventionally, this type of substrate cooling apparatus, by proportional-plus-integral-plus-derivative (PID) control or the like, maintains the cooling plate, which supports substrates during cooling thereof, at the same temperature as a target temperature to which substrates are to be cooled.

Substrate temperature falls rapidly during an initial cooling period but, owing to a control lag due to the heat capacity of the cooling plate, the cooling rate becomes lower as the substrate temperature approaches the target temperature. Thus, a long time is consumed in cooling the substrate, which results in the disadvantage that the apparatus has low throughput.

It has been a recent trend that, with a system having various process modules, a reduction in the number of cooling plates is required in order to reduce the size and cost of the system. However, this requirement has not been met because of the extended cooling time noted above.

Specifically, the conventional substrate cooling apparatus consumes about 45 seconds in treating one substrate, including its transportation into and out of the apparatus. Assume, for example, a system in which one such substrate cooling apparatus cooperates with first and second, photoresist applying apparatus each of which consumes 60 seconds in processing one substrate, and first, second and third developing apparatus each of which consumes 90 seconds in processing one substrate. In this case, as shown in the time chart of FIG. 7B, a waiting time occurs with each developing apparatus, and a long time is needed for completion of the developing process. This results in low processing efficiency. In order to improve the processing efficiency, two substrate cooling apparatus must be used. Consequently, the overall system will require a large installation space and here will increased cost. In FIG. 7B, "A" denotes substrates processed by the first applying apparatus, while "B" denotes substrates processed by the second applying apparatus, with the numerals showing the order in which the substrates are processed.

SUMMARY OF THE INVENTION

A primary object of the present invention is to provide a substrate cooling apparatus for cooling substrates at high speed to reduce processing time, so that a system composed of predetermined process modules has enhanced processing efficiency with a reduced number of such substrate cooling apparatus.

Another object of the invention is to provide a substrate cooling apparatus which ends cooling of substrates in a simple manner.

A further object of the invention is to provide a substrate cooling apparatus capable of cooling a plurality of substrates under identical conditions.

Other objects of the invention will be apparent from studying the embodiments thereof described hereinbelow.

The above primary object is fulfilled, according to the present invention, by a substrate cooling apparatus having a treating chamber for receiving a substrate, a cooling plate for supporting the substrate in the treating chamber, and a cooling device for cooling the substrate supported on the cooling plate. A target temperature setter is used for setting a target temperature to which the substrate is to be cooled, a drive device is used for driving the cooling device to cool the cooling plate below the target temperature, and a control device is used for switching the substrate so that it is free from the thermal influence of the cooling plate after the substrate is found to have reached the target temperature.

This substrate cooling apparatus starts a cooling operation by driving the cooling device to cool the cooling plate below the substrate cooling target temperature. At this time, the cooling device is driven at a greater power than for attaining the substrate cooling target temperature. Consequently, the cooling plate is cooled below the target temperature to cool the substrate at high speed. When the substrate has reached the target temperature, regardless of the cooling plate temperature, the substrate is placed so that it is free from the thermal influence of the cooling plate to complete the cooling operation.

Thus, in the substrate cooling apparatus according to the present invention, the cooling device is driven, upon start of a cooling operation, to cool the cooling plate below the target temperature in order to cool the substrate at high speed. This achieves a reduction in the time required to cool the substrate to the target temperature.

For example, the time consumed in treating one substrate, including transportation thereof into and out of the apparatus, may be reduced to about 30 seconds. Assume a system, as noted hereinbefore, in which one substrate cooling apparatus cooperates with, first and second photoresist applying apparatus each of which consumes 60 seconds in processing one substrate, and first, second and third developing apparatus each of which consumes 90 seconds in processing one substrate. In this case, as shown in the time chart of FIG. 7A, no waiting time occurs with each developing apparatus so that, the time consumed until completion of the developing process is shortened to improve processing efficiency. In FIG. 7A, as in the case of prior art, "A" denotes substrates processed by the first applying apparatus, while "B" denotes substrates processed by the second applying apparatus, with the numerals showing the order in which the substrates are processed.

Where a substrate treating system is composed of predetermined process modules, processing efficiency is improved a reduced number of substrate cooling apparatus all utilized. The substrate treating system requires a reduced installation space, while the substrate cooling apparatus is reduced in size and cost.

Another object noted above is fulfilled, according to the present invention, by a substrate cooling apparatus that also comprises a device for raising and lowering the substrate relative to the cooling plate, the control device which controls the substrate raising and lowering device actuated to separate the substrate and the cooling plate from each other when the substrate is found to have reached the target temperature, thereby freeing the substrate from the thermal influence of the cooling plate.

This substrate cooling apparatus advantageously utilizes the substrate raising and lowering device included in this type of apparatus for transferring the substrate to and from the cooling plate. That is, this apparatus ends the cooling treatment of the substrate by moving the substrate a predetermined distance away from the cooling plate. This is accomplished by operating the substrate raising and lowering device through a selected vertical stroke to move the substrate the required predetermined distance away from the cooling plate when ending the cooling treatment. This way of ending substrate cooling is simpler and more economical than, for example, providing a heat insulating plate movable into and out of a space between the substrate and the cooling plate to shut off the thermal influence.

The further object noted above is fulfilled, according to the present invention, by a substrate cooling apparatus that also comprises an initial drive device for controlling the cooling device to cool the cooling plate to an initial temperature equal to or below the target temperature, and a substrate detector for detecting the substrate placed on the cooling plate to actuate the drive device. The control device actuates the initial drive device when the substrate is found to have reached the target temperature.

According to this substrate cooling apparatus, when the substrate is placed on the cooling plate, the cooling device is driven to cool the cooling plate below the target temperature to cool the substrate at high speed. When the substrate reaches the target temperature, the initial drive device effects the control to cool the cooling plate to the initial temperature equal to or below the target temperature. Consequently, the cooling plate has a fixed starting temperature for a plurality of substrates.

This substrate cooling apparatus is capable of cooling a plurality of substrates at high speed and under the same conditions. This latter feature assures a uniform quality of treatment.

BRIEF DESCRIPTION OF THE DRAWINGS

For the purpose of illustrating the invention, there are shown in the drawings several forms which are presently preferred, it being understood, however, that the invention is not limited to the precise arrangements and instrumentalities shown.

FIG. 6 is a block diagram of a second embodiment of the invention.

FIG. 7A is a time chart illustrating an effect of the invention.

FIG. 7B is a time chart illustrating the prior art.

DESCRIPTION OF THE PREFERRED EMBODIMENTS

Figure 1:
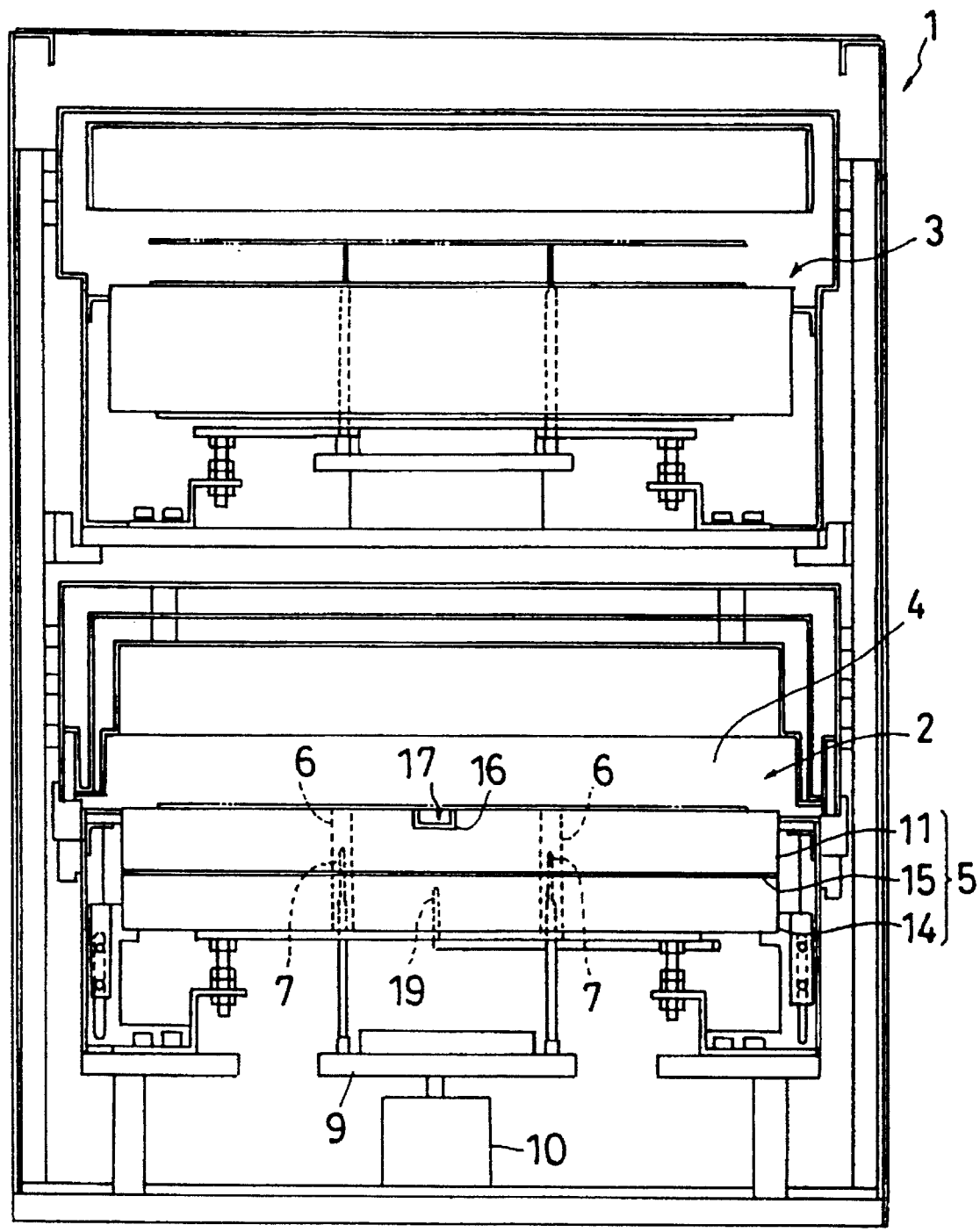
FIG. 1 is an overall view in vertical section of a substrate cooling apparatus constructed according to a first embodiment of the present invention.
Figure 2:
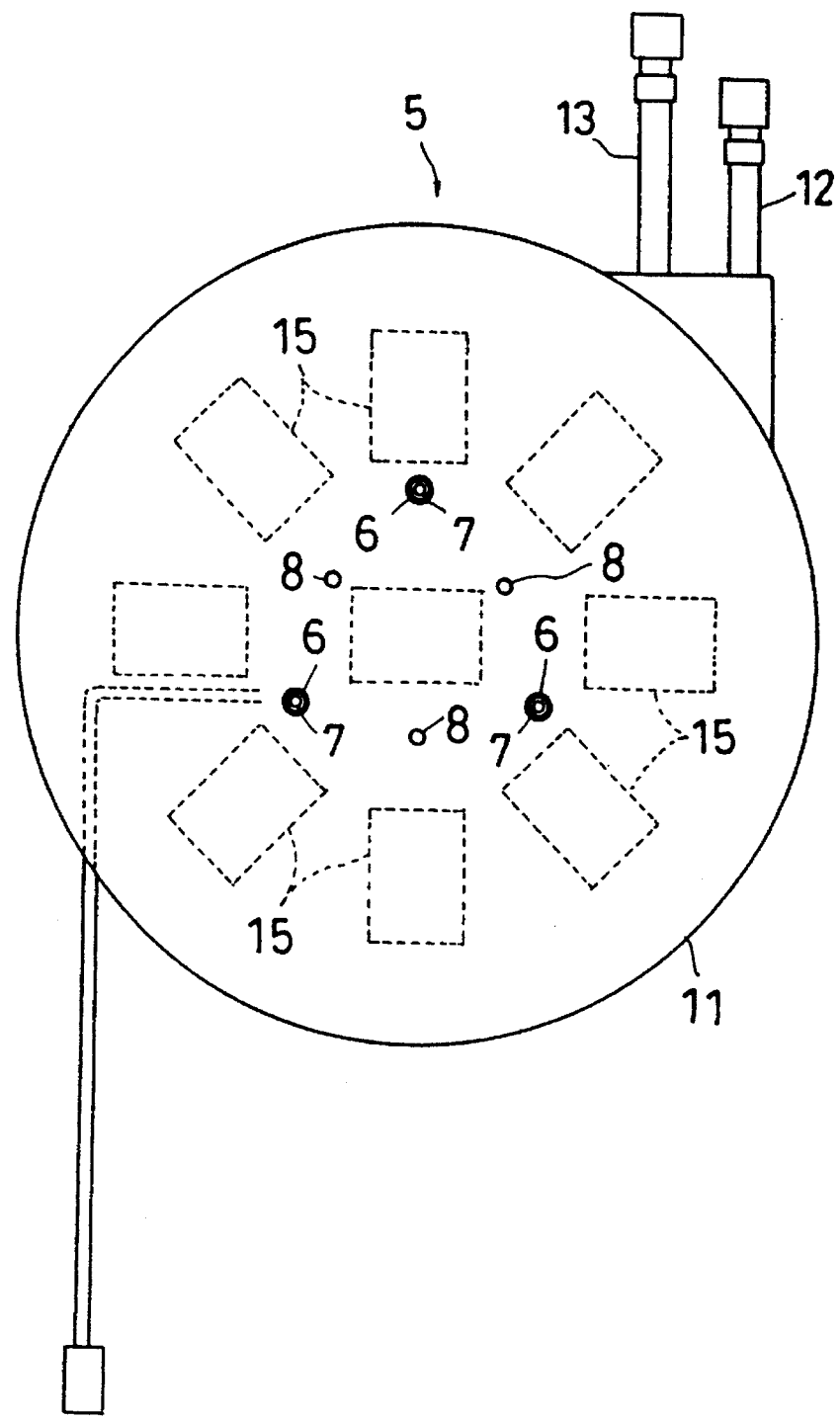
FIG. 2 is a plan view of a principal portion of the substrate cooling apparatus illustrated in FIG. 1.

A first an embodiment of the present invention will be described hereinafter with particular reference to the overall view in vertical section of a first embodiment of the present invention. FIG. 1 a plan view of a cooling plate assembly 5 (FIG. 2) of the first embodiment. The illustrated apparatus includes a housing 1 having a substrate cooling device 2 mounted in a lower portion thereof, and a substrate heating device 3 mounted in an upper portion.

The substrate cooling device 2 includes a treating chamber 4 housing a cooling plate assembly 5. The plate assembly 5 defines perforations 6 for vertically movably receiving substrate support pins 7. Further, proximity balls 8 are arranged on the plate assembly 5 to form a predetermined gap (i.e. a proximity gap) between a substrate or wafer W and the surface of the plate assembly 5. This gap is formed to enhance a uniform cooling effect.

The substrate support pins 7 are rigidly connected to a support member 9 operatively connected to an air cylinder 10 extendible and contractible to vertically move the support pins 7. When the support pins 7 are raised, the wafer W is placed on or removed from the support pins 7 by a substrate transport robot (not shown). The wafer W is moved to a position resting on the proximity balls 8 on the cooling plate assembly 5 by lowering the support pins 7.

The cooling plate assembly 5 includes an aluminum heat conduction plate 11 for supporting the wafer W, an aluminum water-cooled radiating plate 14 to which a water supply pipe 12 and a water drain pipe 13 are connected, and quick-cooling Peltier elements 15 interposed between the heat conduction plate 11 and radiating plate 14. The radiating plate 14 is provided for radiating heat of the Peltier elements 15. The Peltier elements 15 used are capable, when driven at full power, of cooling the cooling plate assembly 5 to a temperature below a wafer cooling target temperature Tsw.

The heat conduction plate 11 has a wafer temperature sensor 17 mounted in a central region thereof for measuring the temperature Tw of the wafer W. The sensor 17 is thermally insulated from the conduction plate 11 by a heat insulator 16. On the other hand, the radiating plate 14 has a plate temperature sensor 19 mounted in a central region thereof for measuring the temperature Tp of the cooling plate assembly 5 cooled by the Peltier elements 15.

Figure 3:
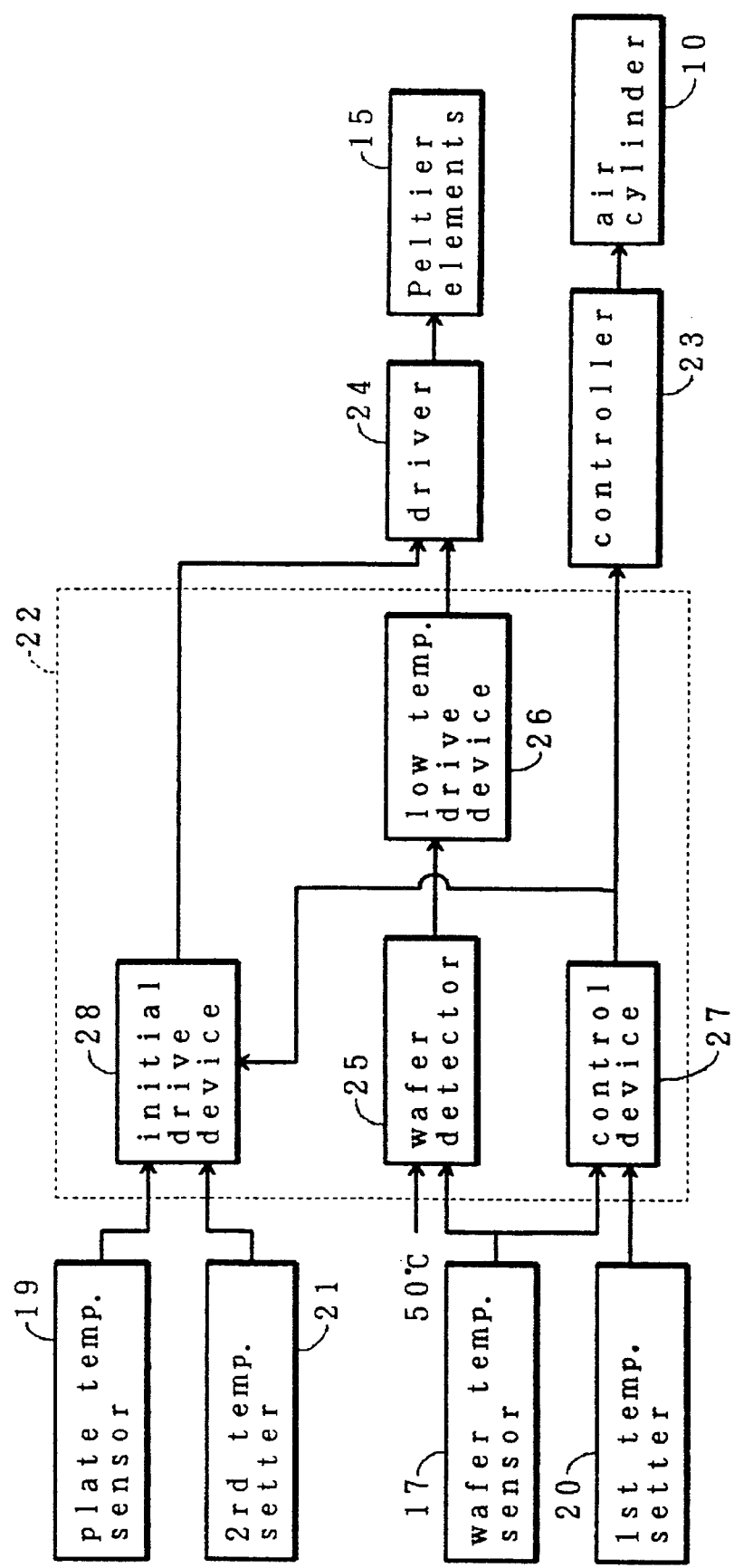
FIG. 3 is a block diagram of the first embodiment.

Referring to the block diagram shown in FIG. 3, the wafer temperature sensor 17 and plate temperature sensor 19 are connected to a microcomputer 22, along with a first temperature setter 20 for setting the wafer cooling target temperature Tsw (e.g. 20° C.) and a second temperature setter 21 for setting an initial temperature Tsp of the cooling plate assembly 5. Further, a controller 23 for controlling the air cylinder 10 and a driver 24 for driving the Peltier elements 15 are connected to the microcomputer 22.

The microcomputer 22 includes a wafer detector 25, a low temperature drive device 26, a control device 27 and an initial drive device 28.

The wafer detector 25 compares the temperature measured by the wafer temperature sensor 17 and a predetermined temperature (e.g. 50° C.) higher than the wafer cooling target temperature Tsw. Thus, the detector 25 detects the wafer W placed on the cooling plate assembly 5, based on an incoming wafer temperature $Tw_0$ which is a high temperature prior to cooling, and outputs a cooling start signal.

In response to the cooling start signal from the wafer detector 25, the low temperature drive device 26 outputs a drive signal to the driver 24. Then the driver 24 drives the Peltier elements 15 at full power to cool the cooling plate assembly 5 to a temperature below the wafer cooling target temperature Tsw and above a dew point.

The control device 27 compares the temperature Tw of wafer W detected by the wafer temperature sensor 17 and the target temperature Tsw set through the first temperature setter 20. When the temperature Tw equals the target temperature Tsw, the control device 27 outputs a cooling finish signal to the controller 23. Then, the substrate support pins 7 are raised to move the wafer W to a position spaced from and outside the sphere of thermal influence of the cooling plate assembly 5.

The initial drive device 28, in response to the cooling finish signal from the control device 27, outputs a control signal to the driver 24. The Peltier elements 15 are driven under PID control such that temperature Tp of the cooling plate assembly 5 measured by the plate temperature sensor 19 becomes the initial temperature Tsp set through the second temperature setter 21.

Figure 4:
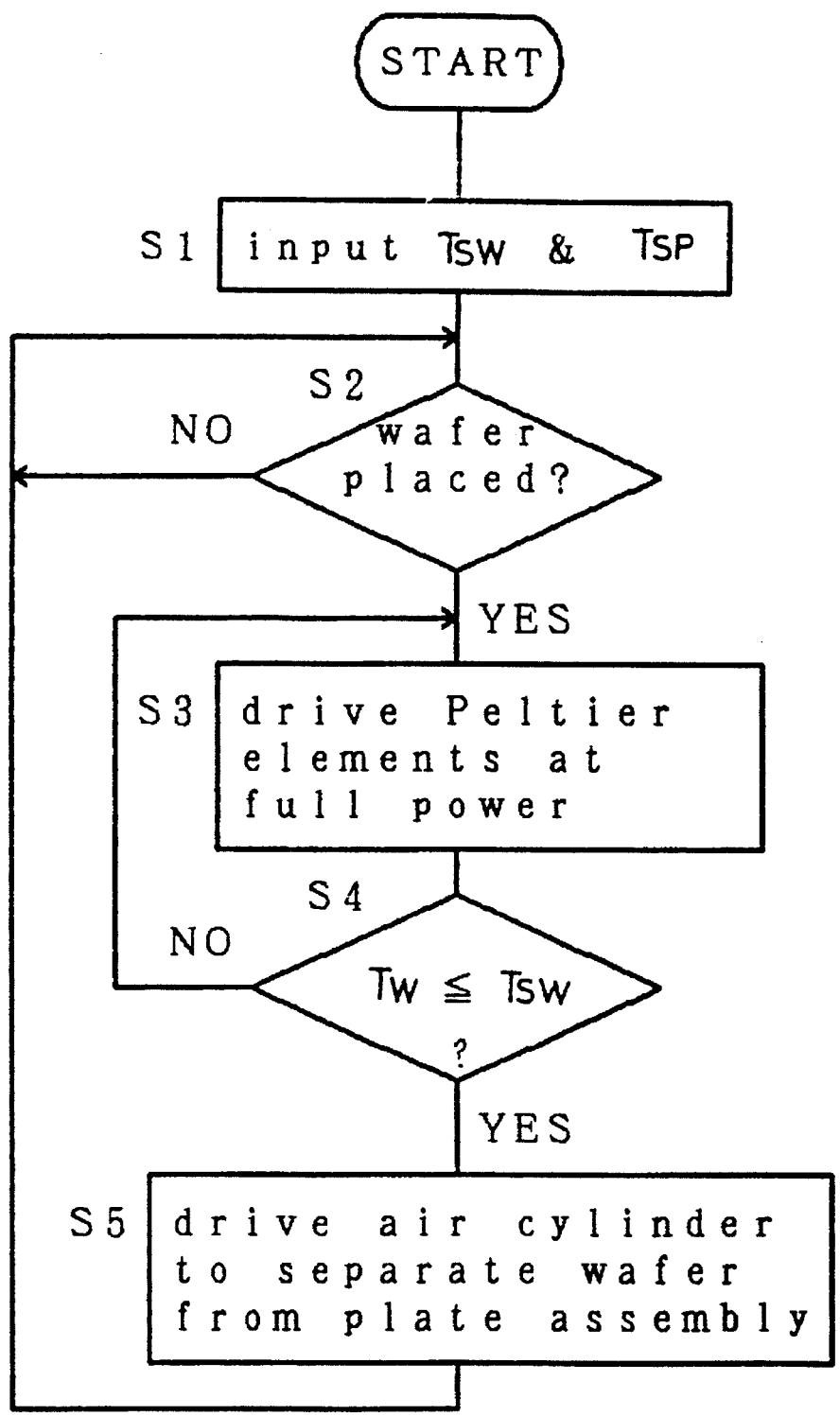
FIG. 4 is a flowchart of a control operation.

A sequence of cooling control will be described next with reference to the flowchart shown in FIG. 4 and the time chart shown in FIG. 5.

First, the wafer cooling target temperature Tsw and the initial temperature Tsp of the cooling plate assembly 5 are set (S1). The wafer cooling target temperature Tsw is a temperature to which the wafer W is to be cooled, which is 20° C. for example. The initial temperature Tsp of the cooling plate assembly 5 is set equal to or below the target temperature Tsw, and thus no higher than the Tsp of 20° C. Subsequently, the wafer detector 25 is operated to determine whether the wafer W is placed on the cooling plate assembly 5 (S2). Before the wafer W is placed for treatment, the Peltier elements 15 are driven by the driver 28 under PID control, as described in detail hereinafter, to maintain the cooling plate assembly 5 at the initial temperature Tsp.

When the wafer W is placed on the cooling plate assembly 5, step S3 is executed for causing the drive device 26 to drive the Peltier elements 15 at full power. This cooling action is continued till the temperature Tw of wafer W is found at step S4 to equal the target temperature Tsw. In this cooling action, the Peltier elements 15 are driven at full power instead of varying their cooling power based on outputs of the plate temperature sensor 19 and wafer temperature sensor 17. Under such control, the Peltier elements 15 are driven to lower the temperature of the cooling plate assembly 5 below the wafer cooling target temperature Tsw (e.g. 20° C.). The full-power cooling is effected regardless of the output of the plate temperature sensor 19, to the extent of maintaining the cooling plate assembly 5 above the dew point. If the cooling plate assembly 5 were cooled below the dew point, dew could form and adhere to the wafer W. Thus, though not illustrated, the drive device 26 also monitors the output of the plate temperature sensor 19. When the temperature of the cooling plate assembly 5 falls to the dew point, the Peltier elements 15 are turned down or off to avoid the plate assembly 5 being cooled below the dew point.

Figure 5:
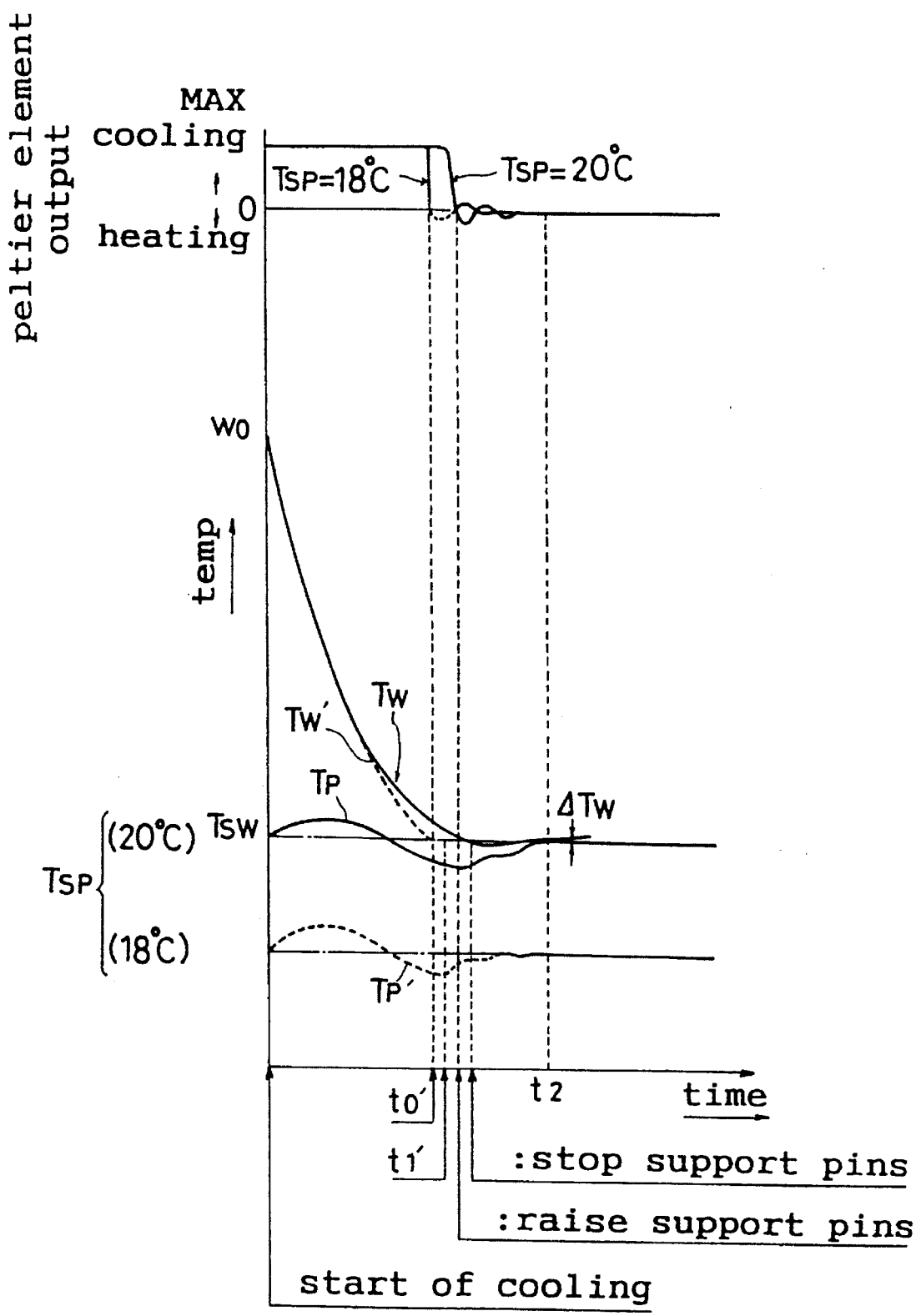
FIG. 5 is a time chart of the control operation.

When the hot wafer W to be cooled is placed on the cooling plate assembly 5, the temperature Tp of the cooling plate assembly 5 temporarily increases as shown in FIG. 5. However, since the Peltier elements 15 are driven at full power, the temperature of the plate assembly 5 soon becomes lower than the wafer cooling target temperature Tsw and initial temperature Tsp. Meanwhile the wafer W is rapidly cooled toward the target temperature Tsw.

When the temperature Tw of the wafer W reaches the target temperature Tsw, step S5 is executed whereby the control device 27 causes the wafer W to be moved outside the sphere of thermal influence of the cooling plate assembly 5 (which takes about 2 seconds from time t0 to time t1), thereby completing the cooling operation of wafer W. At the same time, the initial drive device 28, by PID control of the Peltier elements 15, returns the temperature Tp of the cooling plate assembly 5 to the initial temperature Tsp set through the second temperature setter 21. By repeating the above process, wafers W are cooled to a room temperature of 20° C. and transferred to a next processing stage.

With the above construction, the wafer W is cooled at high speed and, after completion of each cooling operation, the cooling plate assembly 5 is returned to the initial temperature Tsp to cool the respective wafers W under the same condition.

Consideration is made hereunder of a relationship with time of temperature variation ΔTw of the wafer w after being moved to the position outside the sphere of thermal influence of the cooling plate assembly 5. Temperature variation ΔTw follows a temperature history expressed by the following equation (1) based on the temperature ΔT of wafer W (which at this time equals the target temperature) and ambient temperature around the cooling plate assembly 5:

$$\Delta Tw = \Delta T \cdot (1 - \exp^{-\alpha \cdot 2A \cdot t/c_w}) \qquad (1)$$

where Δ is a heat transfer coefficient of a wafer surface, A is a surface area of the wafer, t is a waiting time before removal, and CW is a heat capacity of the wafer.

Assume, for example, that the wafer W is 8 inch size, ΔT=4° C., CW=8.86×10$^{-3}$ [Kcal/° C.], and α=2.0 [Kcal/m$^2$h° C.] (the calculated values confirmed through experiment). Then the wafer W shows a temperature increase ΔTw=0.15° C. when t=10 seconds. It has been confirmed through experiment that hardly any temperature variation of the wafer W occurs during upward movement of the support pins 7 (about 2 seconds). Thus, temperature variation ΔTw of the wafer W occurring 12 seconds from start of the upward movement of the support pins 7 is no more than 0.15° C. This temperature variation is small compared with a temperature control precision required for attaining the target temperature. It will be seen that, as noted above, the wafer W may advantageously be moved away from the cooling plate assembly 5 upon completion of the cooling operation.

Further, in the above equation (1), when t=41 seconds, temperature variation ΔTw of the wafer W is 0.6° C. Thus, the waiting time may be up to 41 seconds if a normal range of temperature control precision is 0.6° C. This enables wafers W to be cooled successively and effectively.

Next, consideration is made as to the distance the wafer W is moved to be free from the thermal influence of the cooling plate assembly 5.

The temperature Tp of the cooling plate assembly 5 is below the temperature of the wafer W at a moment the support pins 7 are raised to move the wafer W away from the plate assembly 5. This temperature difference is variable with the cooling capacity of the plate assembly 5, but temperature difference ΔT=5° C. is assumed here (which is believed appropriate since a greater temperature difference would result in dewing).

During the waiting time of 10 seconds as noted above, the cooling plate assembly 5 is heated back to the original temperature. If ΔT=5° C. is maintained during this period, a heat exchange between the cooling plate assembly 5 and wafer W is derived from the following equation (2):

$$q = \lambda \cdot \Delta T \cdot A/h \qquad (2)$$

where λ is the thermal conductivity of air which is 0.0221Kcal/m$^{2h\circ}$ C., A is a heat transfer area or wafer projected area, and h is a distance between wafer W and cooling plate assembly 5.

On the other hand, the heat capacity CW of the 8-inch wafer W is expressed by the following equation:

$CW=8.86\times 10^{-3}[Kcal/^\circ C.]$

If temperature variation $\Delta Tw$ of the wafer W permitted to occur during the waiting time of 10 seconds is 0.1° C., h is derived from the following equation:

$h=(\lambda\cdot\Delta T\cdot A\times 10\times 1000) / (CW\cdot\Delta Tw\times 3600)=10.88$ mm Thus, the wafer W moved by at least the above distance is free from the thermal influence of the cooling plate assembly 5.

On the other hand, there is a limit to the moving distance of the substrate support pins 7. If, for example, the moving distance of the 8-inch wafer W is about 13 mm, the wafer W may be moved to a distance of 10.9 to 13 mm from the cooling plate assembly 5.

The foregoing description has been made, exemplifying the case of setting the wafer cooling target temperature Tsw and the initial temperature. Tsp of cooling plate assembly 5 to the same 20° C. However, the target temperature Tsw may be set to 20° C., and the initial temperature Tsp of cooling plate assembly 5 to a lower temperature, e.g. 18° C. FIG. 5 shows Tw, Tp and Peltier element output in solid lines where both Tsw and Tsp are 20° C., and Tw', Tp' and Peltier element output in broken lines where Tsw is 20° C. and Tsp 18° C. A faster cooling treatment is possible where the initial temperature Tsp of cooling plate assembly 5 is 18° C. than where the initial temperature Tsp is set to the same 20° C. as the wafer cooling target temperature Tsw.

The above temperature setting achieves a reduced time for the wafer W to reach the target temperature Tsw. This results in a correspondingly reduced difference between the temperature Tp' of cooling plate assembly 5 at a point of time t0' the wafer W reaches the target temperature Tsw, and the initial temperature Tsp of cooling plate assembly 5. Consequently, the cooling plate assembly 5 may be returned to the initial temperature by PID control or the like in a reduced time.

In FIG. 5, Tp and Tp' are staggered to enhance clarity of illustration. The difference in initial temperature Tsp between Tp and Tp' is 2° C. which is smaller than $\Delta T=5°$ C. Thus, strictly speaking, the two graphs are closer together.

FIG. 6 is a block diagram of a second embodiment which differs from the first embodiment in the following respect.

The microcomputer 220 of FIG. 6 includes a comparator 29 acting as the initial drive device. A third temperature setter 30 is connected to the comparator 29 along with the plate temperature sensor 19, the third temperature setter 30 being operable to set a temperature Tap (e.g. 18° C.) lower than the wafer cooling target temperature Tsw. In response to the drive signal from the drive device 26, the comparator 29 compares the set temperature Tap and the temperature Tp of the cooling plate assembly 5 measured by the plate temperature sensor 19, and outputs a control signal to the driver 24 to cool the wafer W. Consequently, the cooling plate assembly 5 is controlled to be at the temperature Tap set through the third temperature setter 30. The other aspects of the construction and operation are the same as in the first embodiment.

In the second embodiment, the temperature control of the cooling plate assembly 5 by the output of the comparator 29 may be continued after cooling of the wafer W, to maintain the cooling plate assembly 5 constantly at the set temperature. This allows the cooling operation to be started for the respective wafers W under the same invariable condition.

The foregoing embodiments have the wafer temperature sensor 17 for measuring the temperature Tw of wafer W to determine whether the temperature Tw has reached the target temperature Tsw or not. For example, a temperature sensor may be attached to one of the proximity balls 8 or cylindrical elements for forming the proximity gap, to measure the temperature Tw of wafer W directly, or a non-contact type temperature sensor such as a radiation thermometer may disposed adjacent the cooling plate assembly 5. Where the temperature $Tw_0$ of wafer W transported into the substrate cooling device 2 is constant, a period of time required for the wafer W to reach the target temperature Tsw may be determined in advance in order to use this period of time for the temperature checking purpose. A correlation between the temperature Tp of cooling plate assembly 5 and the wafer W may be determined through experiment beforehand, so that the temperature of wafer W may be checked indirectly base on temperature variations of the cooling plate assembly 5.

In the foregoing embodiments, the wafer temperature sensor 17 is used to determine whether the wafer W is placed on the cooling plate assembly 5 or not. Alternatively, the plate temperature sensor 19 may be used to compare the plate temperature with a predetermined temperature in order to determine whether the wafer W is placed on the cooling plate assembly 5 or not. That is, the cooling plate assembly 5 is heated appreciably by the wafer W placed thereon, and this may be used as a basis for determining arrival of the wafer W.

In the foregoing embodiments, the wafer detector 25 detects the wafer W placed on the cooling plate assembly 5, and outputs the cooling start signal. However, the cooling start signal may be outputted without relying on detection of the wafer W placed on the plate assembly 5. In this case, for example, a separate control device is provided to supervise timing of placing the wafer W on the plate assembly 5, decide based on time that the wafer W has been placed, and output a cooling start signal.

In the foregoing embodiments, the Peltier elements 15 are driven at full power when the wafer W is introduced. The present invention is not limited to the full-power drive, but the cooling plate assembly 5 may be controlled otherwise to have a lower temperature than the wafer cooling target temperature Tsw, for example. In short, it will serve the purpose of the invention as long as the cooling plate assembly 5 has a lower temperature than the target temperature Tsw.

In the foregoing embodiments, the wafer W is raised to a position outside the sphere of thermal influence of the cooling plate assembly 5. Instead of raising the wafer W, the cooling plate assembly 5 may be lowered. To free the wafer W from the thermal influence of the plate assembly 5, a heat insulating plate may be inserted between the lower surface of wafer W and the upper surface of cooling plate assembly 5 when the wafer W has reached the target temperature.

In the foregoing embodiments, the cooling plate assembly 5 includes Peltier elements 15 and radiating plate 14. These components may be replaced with other devices such as a refrigerant type cooling device.

In the foregoing embodiments, the wafer W is supported on the cooling plate assembly 5 with the proximity gap formed therebetween. However, the wafer W may be placed in direct contact with the plate assembly 5.

The present invention may be embodied in other specific forms without departing from the spirit or essential attributes thereof and, accordingly, reference should be made to the appended claims, rather than to the foregoing specification, as indicating the scope of the invention.

What is claimed is:

1. A substrate cooling apparatus comprising:
   a treating chamber for receiving a substrate, a cooling plate for supporting said substrate in said treating chamber, and cooling means for cooling said substrate supported on said cooling plate;

target temperature setting means for setting a target temperature to which said substrate is to be cooled;

drive means for driving said cooling means to cool said cooling plate below said target temperature; and control means, operative when said substrate is found to have reached said target temperature, for switching said substrate to a condition free from thermal influence of said cooling plate;

initial drive means for controlling said cooling means to cool said cooling plate to an initial temperature no higher than said target temperature; and substrate detecting means for detecting said substrate placed on said cooling plate to actuate said drive means; and said control means being operable to actuate said initial drive means when said substrate is found to have reached said target temperature.

2. A substrate cooling apparatus as defined in claim 1, further comprising:

substrate raising and lowering means for raising and lowering said substrate relative to said cooling plate; and said substrate raising and lowering means being controlled by said control means to separate said substrate and said cooling plate from each other when said substrate is found to have reached said target temperature, to free said substrate from thermal influence of said cooling plate.

3. A substrate cooling apparatus as defined in claim 1, wherein said cooling means includes Peltier elements.

4. A substrate cooling apparatus as defined in claim 1, wherein said cooling plate is constructed to support said substrate with a slight gap maintained therebetween.

5. A substrate cooling apparatus as defined in claim 1, wherein said cooling plate is constructed to support said substrate in tight contact therewith.

6. A substrate cooling apparatus as defined in claim 2, wherein said cooling means includes Peltier elements.

7. A substrate cooling apparatus as defined in claim 2, wherein said cooling plate is constructed to support said substrate with a slight gap maintained therebetween.

8. A substrate cooling apparatus as defined in claim 6, wherein said cooling plate is constructed to support said substrate with a slight gap maintained therebetween.

* * * * *